United States Patent [19]

Gidley et al.

[11] 4,144,108
[45] Mar. 13, 1979

[54] SUPPORT

[75] Inventors: John A. F. Gidley, Sutton Coldfield; Barry F. Irving, Aldridge; Barry K. Johnson, Alum Rock, all of England

[73] Assignee: Imperial Metal Industries (Kynoch) Limited, Birmingham, England

[21] Appl. No.: 888,390

[22] Filed: Mar. 20, 1978

Related U.S. Application Data

[63] Continuation of Ser. No. 716,457, Aug. 23, 1976, abandoned.

[30] Foreign Application Priority Data

Aug. 26, 1975 [GB] United Kingdom ............... 35202/75

[51] Int. Cl.² ............................................ A01F 25/12
[52] U.S. Cl. .......................................... 156/60; 34/12; 34/239; 101/382 MV; 211/DIG. 1; 427/372 R; 428/900

[58] Field of Search ................ 156/60, 297, 299, 300, 156/306, 309; 428/242, 432, 433, 434, 440, 441, 900; 427/127, 128, 372 R, 372 A, 372 B; 96/86 P, 33, 35.1; 101/456, 473, 382 MV; 211/DIG. 1; 34/12, 148, 151, 158, 192, 236-239

[56] References Cited

U.S. PATENT DOCUMENTS

| 2,148,696 | 2/1939 | Kampfer | 34/148 |
| 2,599,359 | 6/1952 | Banks et al. | 156/309 |
| 3,232,787 | 2/1966 | Bennett | 428/433 |
| 3,249,466 | 5/1966 | Lusher | 427/128 |
| 3,282,765 | 11/1966 | Pine et al. | 156/247 |
| 3,598,678 | 8/1971 | Rex | 101/382 MV |
| 3,820,460 | 6/1974 | McIreath | 101/382 MV |
| 3,824,927 | 7/1974 | Pugh et al. | 101/395 |
| 3,832,176 | 8/1974 | Verstraete et al. | 96/86 P |
| 3,861,921 | 1/1975 | Hoffman et al. | 96/86 P |

Primary Examiner—John E. Kittle
Attorney, Agent, or Firm—Cushman, Darby & Cushman

[57] ABSTRACT

A method of supporting a ferromagnetic sheet having a tacky layer on its upper surface comprises locating the sheet on a support which comprises a sheet of glass having on its upper surface a layer of magnetic material.

5 Claims, 2 Drawing Figures

SUPPORT

This is a continuation, of application Ser. No. 716,457 filed Aug. 23, 1976 now abandoned This invention relates to methods of supporting sheets of ferromagnetic material.

BACKGROUND AND SUMMARY OF THE INVENTION

The method of the invention has been devised to be particularly useful in the manufacture of a particular form of printing plate. The invention is not, however, limited to such a use. At one stage during the production of the plate, sheet steel blanks of approximately 1m × ½m have to be passed through an oven to cure the tacky photopolymerisable material on the upper surface of the blank. This tacky material has been applied so as to have an extremely uniform thickness, typically 0.030 inch ±0.0015 inch. If the sheet is not maintained flat, the tacky material will flow from the high points of the sheet during drying and curing to reduce the uniform layer of tacky material to a useless non-uniform layer. It is thus a requirement of the manufacturing process that the sheet steel be maintained flat during the drying operation and in particular when the sheet is in an oven. One possible method of supporting the blank is to place it on a steel slab before it is passed into the oven. Unfortunately, the sheet tends to curl and has to be held down by adhesive tape. It has also been found that the slabs tend to distort and to become uneven during heating to temperatures as small as 100° C. It is believed that the machining of the slab imparts heavy surface stresses into the material and as these are annealed out, the material distorts.

It is required, therefore, for the purposes of the invention to provide a support which does not distort on heating to temperatures of the order of 100° C. and which is flat and planar over large areas.

The magnetic material may be a layer of elastomeric magnetic material. The elastomeric magnetic material may be adhesively bonded to the glass. The bond may be by means of double-sided adhesive tape.

The elastomeric material may be a sheet of rubber containing permanently magnetic particles.

The glass may be plate glass or float glass.

The present invention provides a method of supporting a sheet of magnetic material having a mobile tacky layer thereon which comprises the steps of:
1. locating the sheet of magnetic material on a support, the support comprising a sheet of glass having a flat planar surface with a uniform thickness layer of magnetic material thereon
2. maintaining the glass horizontal and level.

The layer of glass and sheet material may be passed through a drying oven at a temperature below the Curie point for the magnetic material to cure or dry the magnetic material. The oven may be maintained at a temperature in the range 75° C. to 175° C.

The tacky material may be a photopolymerisable material, and the sheet material may be sheet steel. The tacky material may be sheet steel. The tacky material may have a viscosity in the range 1 to 1 × 10⁴ poises.

Further, according to the invention, in a method of drying and/or curing a layer of mobile tacky material on a magnetic sheet, there is provided the method of supporting the magnetic sheet upon a sheet of glass having a flat, planar surface and a uniform thickness layer of magnetic material on the flat planar surface.

The magnetic material may be a layer of elastomeric magnetic material, such as a sheet of rubber containing permanently magnetic particles. The glass may be plate glass or float glass.

BRIEF DESCRIPTION OF THE DRAWINGS

By way of example, embodiments of the present invention will now be described with reference to the accompanying drawings of which.

DESCRIPTION OF THE PREFERRED EMBODIMENTS

Figure 1:
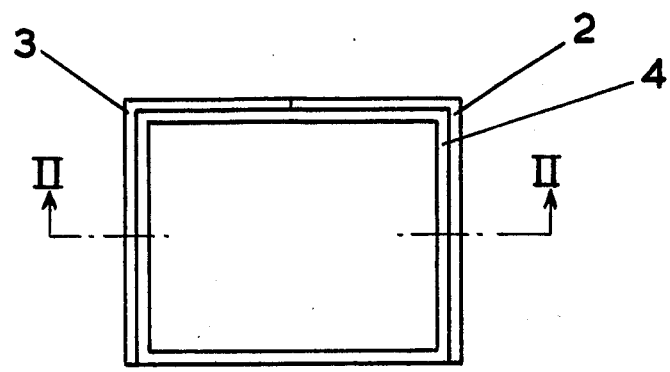
FIG. 1 is a plan view of a sheet of steel upon a magnetic support.
Figure 2:
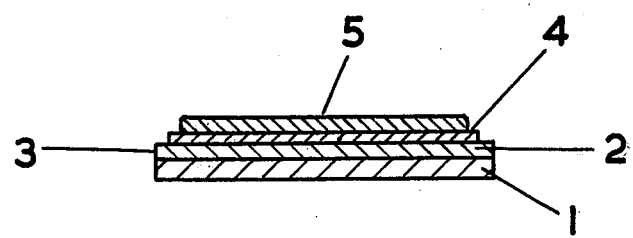
FIG. 2 is a cross-section along the line II—II of FIG. 1.

The support comprises a sheet of float glass 1 upon which is stuck two sheets of elastomeric rubber 2,3. The elastomeric rubber is stuck to the glass by means of double-sided adhesive available under the trade mark "Sellotape". Located on top of the magnetic rubber layer is a sheet of steel 4 having a thickness of the order of 0.010 inch. The sheet steel 4 carries an upper layer 5 of mobile tacky material such as a photopolymerisable plastic material. The magnetic layer 2, being intimately bonded to the surface of the glass, remains completely flat. Because of the large area involved, the sheet steel 4 is formally affixed to the magnetic layer and is also therefore kept flat. Provided the glass can be supported in a level condition, the sheet steel and the polymer layer will also remain flat and level.

The glass and the magnetic material may be heated to help dry out or cure the polymerisable layer 5 without any distortion occurring in the glass. The glass continues to remain flat irrespective of the number of times it is cycled, typically to 100° C. and back to room temperature. Since drying ovens are normally kept below the Curie point of the magnetic material, it is also unaffected and remains permanently magnetic.

In contrast to the use of glass as the main support for the magnetic material, sheet steel was tried but it is extremely difficult to keep sheet steel flat. Even in thicknesses up to ½ inch, there is a large amount of variation in flatness in surfaces of typically 1m × 1m. The normal method of producing surface ground steel plates is to hold the sheet of metal by the use of a magnetic chuck and to grind the surface flat. If the starting material is curved in any way, this curve is not removed by the surface grinding. All that happens is the magnetic chuck flattens the surface and the surface is then ground smooth. Once the sheet is removed from the magnetic chuck, it simply re-assumes its old curved condition. It has been found almost impossible to obtain steel plates which have flat planar surfaces with reasonable thicknesses. Further, when the plate is annealed during the heating operation, stresses in the plate are annealed out and this further distorts the plates. It is not possible with reasonable thickness steel layers to maintain large surfaces completely flat and planar as is easily possible with plate or float glass.

It will be appreciated that a single sheet of magnetic material could be used and that the material could be stuck to the plate glass by means of a conventional adhesive or the elastomeric material could be made self-adhesive. The thickness of the polymeric material was typically 0.050 inch and the thickness of the sheet of magnetisable steel 4 was typically 0.01 inch. It was found after drying that the polymerisable material had been kept so level that the thickness of the layer did not vary by more than 0.0015 inch from the mean over the entire surface of the sheet material.

We claim:

1. A method of supporting a sheet of ferromagnetic material having a mobile tacky layer thereon while curing or drying the tacky layer which comprises: locating the sheet of ferromagnetic material on a support, the support comprising a sheet of glass having a flat planar surface with a uniform thickness layer of permanently magnetic material thereon; maintaining the sheet of glass horizontal and level whereby the thickness of the tacky layer is maintained uniform; and passing the sheet of glass and the sheet of ferromagnetic material having the mobile tacky layer thereon through a drying oven at a temperature below the Curie point for the magnetic material to cure or dry the tacky layer.

2. A method as claimed in claim 1 in which the sheet of ferromagnetic material is a steel sheet and the tacky material is a photopolymerisable material.

3. A method as claimed in claim 2 in which the tacky material has a viscosity in the range $1-1 \times 10^4$ poises.

4. A method as in claim 1 wherein the magnetic material is elastomeric.

5. A method of supporting a sheet of ferromagnetic material having a mobile tacky layer on the upper surface thereof while curing or drying the tacky layer which comprises: locating the sheet of ferromagnetic material on a support, the support comprising a sheet of glass having a flat planar upper surface with a uniform thickness layer of elastomeric permanently magnetic material adhered to said upper surface; maintaining the sheet of glass horizontal and level whereby the thickness of the tacky layer is maintained uniform; and passing the sheet of glass, the layer of magnetic material and the sheet of ferromagnetic material having the mobile tacky layer thereon through a drying oven at a temperature below the Curie point for the magnetic material to cure or dry the tacky layer.

* * * * *